United States Patent
Hembree et al.

[11] Patent Number: 6,025,731
[45] Date of Patent: Feb. 15, 2000

[54] HYBRID INTERCONNECT AND SYSTEM FOR TESTING SEMICONDUCTOR DICE

[75] Inventors: David R. Hembree; Salman Akram, both of Boise; Warren M. Farnworth, Nampa; Alan G. Wood, Boise; James M. Wark, Boise; Derek Gochnour, Boise, all of Id.

[73] Assignee: Micron Technology, Inc., Boise, Id.

[21] Appl. No.: 08/821,468

[22] Filed: Mar. 21, 1997

[51] Int. Cl.[7] ........................................................ G01R 1/73
[52] U.S. Cl. .............................................. 324/758; 324/757
[58] Field of Search .................................... 324/754, 755, 324/765, 762, 158.1, 758, 757

[56] References Cited

U.S. PATENT DOCUMENTS

| | | | |
|---|---|---|---|
| 4,697,143 | 9/1987 | Lockwood | 324/754 |
| 4,894,612 | 1/1990 | Drake | 324/158.1 |
| 4,906,920 | 3/1990 | Huff et al. . | |
| 4,918,383 | 4/1990 | Huff et al. . | |
| 4,969,828 | 11/1990 | Bright et al. . | |
| 5,072,289 | 12/1991 | Sugimoto et al. . | |
| 5,177,439 | 1/1993 | Liu et al. . | |
| 5,180,977 | 1/1993 | Huff . | |
| 5,225,037 | 7/1993 | Elder et al. . | |
| 5,264,787 | 11/1993 | Woith et al. . | |
| 5,477,159 | 12/1995 | Hamling | 324/754 |
| 5,483,741 | 1/1996 | Akram et al. . | |
| 5,487,999 | 1/1996 | Farnworth . | |
| 5,506,515 | 4/1996 | Godshalk | 324/762 |
| 5,519,332 | 5/1996 | Wood et al. . | |
| 5,565,788 | 10/1996 | Burr | 324/762 |
| 5,594,358 | 1/1997 | Ishikawa | 324/762 |
| 5,607,818 | 3/1997 | Akram et al. . | |
| 5,678,301 | 10/1997 | Gochnour et al. . | |
| 5,726,075 | 3/1998 | Farnworth et al. . | |
| 5,783,461 | 7/1998 | Hembree . | |
| 5,789,271 | 8/1998 | Akram . | |
| 5,789,278 | 8/1998 | Akram et al. . | |
| 5,801,452 | 9/1998 | Farnworth et al. . | |
| 5,808,360 | 9/1998 | Akram . | |
| 5,815,000 | 9/1998 | Farnworth et al. . | |
| 5,834,366 | 11/1998 | Akram . | |
| 5,834,945 | 11/1998 | Akram et al. . | |
| 5,869,974 | 2/1999 | Akram et al. . | |
| 5,896,036 | 4/1999 | Wood et al. . | |
| 5,915,755 | 6/1999 | Gochnour et al. . | |
| 5,915,977 | 6/1999 | Hebree et al. . | |
| 5,929,647 | 7/1999 | Akram et al. . | |
| 5,931,685 | 8/1999 | Hembree et al. . | |

OTHER PUBLICATIONS

Miyake, Kiyoshi et al., "Connectivity Analysis of New 'Known Good Die' Connection System using Microbumps", Nitto Denko Corporation, Technical Paper, Jan. 1994.

"Cobra™ technology makes Wentworth Labs the world's most advanced probe card manufacturer.", Wentworth Laboratories advertising brochure, Jan. 1996.

"Science Over Art. Our New IC Membrane Test Probe." Packard Hughes Interconnect, advertising brochure, Jan. 1993.

*Primary Examiner*—Josie Ballato
*Assistant Examiner*—Jose M. Solis
*Attorney, Agent, or Firm*—Stephen A. Gratton

[57] ABSTRACT

An interconnect is provided for making electrical connections with a semiconductor die. The interconnect includes a substrate having integrally formed contact members, configured to electrically contact corresponding contact locations on the die. The interconnect also includes a pattern of conductors formed separately from the substrate, and then bonded to the substrate, in electrical communication with the contact members. The conductors can be mounted to a multi layered tape similar to TAB tape, or alternately bonded directly to the substrate. In addition, each conductor can include an opening aligned with a corresponding contact member, and filled with a conductive material, such as a conductive adhesive or solder. The conductive material electrically connects the contact members and conductors, and provides an expansion joint to allow expansion of the conductors without stressing the contact members. Also provided are a system for testing dice that includes the interconnect, and a system for testing wafers wherein the interconnect is formed as a probe card.

23 Claims, 7 Drawing Sheets

HYBRID INTERCONNECT AND SYSTEM FOR TESTING SEMICONDUCTOR DICE

FIELD OF THE INVENTION

This invention relates generally to semiconductor manufacture and specifically to an interconnect for making electrical connections with a semiconductor die for testing or other purposes. This invention also relates to a method for fabricating the interconnect and to a system for testing dice that includes the interconnect.

BACKGROUND OF THE INVENTION

During a semiconductor fabrication process semiconductor dice are formed on a wafer. Subsequent to the fabrication process the dice must be tested to evaluate the electrical characteristics of the integrated circuits formed on the dice. Tests for gross functionality are typically performed at the wafer level by probe testing. Burn-in tests and full functionality tests are typically performed after the dice have been singulated.

If the dice are packaged in a conventional plastic or ceramic package, the package provides an external lead system for testing. If the dice are to remain in an unpackaged condition, temporary packages may be required to house a single die for testing and to certify the die as a known good die (KGD). Some types of packaged dice, such as chip scale packages, can also require temporary packages for testing. U.S. Pat. No. 5,519,332 to Wood et al. discloses a representative temporary package for testing semiconductor dice.

One component of temporary packages for testing semiconductor dice functions as an electrical interconnect. The interconnect includes contact members for making temporary electrical connections with the dice. Typically, the contact members are configured to make electrical contact with corresponding contact locations on the dice, such as bond pads, test pads or fuse pads.

U.S. Pat. No. 5,483,741 to Akram et al. describes one type of interconnect for testing semiconductor dice. This type of interconnect includes a substrate, such as silicon, having integrally formed contact members. The contact members can be etched directly into the substrate and covered with a conductive layer. In addition, the interconnect includes conductors, such as deposited metal traces, for providing conductive paths to and from the contact members. One advantage of this type of interconnect is that the contact members can be formed in dense arrays using semiconductor fabrication processes. Since the contact members are formed integrally with the substrate, their location is fixed relative to the substrate and their CTE can match that of the substrate and a silicon die.

This type of interconnect functions satisfactorily for most types of testing. However, with advances in the architecture of semiconductor devices, it is advantageous to perform some testing of integrated circuits using very high speed testing signals. For example, testing frequencies of 500 MHz and greater are anticipated for some memory products such as DRAMS. The temporary packages and interconnects used to test dice must be capable of transmitting signals at these high speeds without generating parasitic inductance and cross coupling (i.e., "cross talk").

One limitation of deposited metal conductors for interconnects is that the thickness of the metal conductors is limited by conventional deposition processes. Typically, CVD deposited metal conductors can be formed with a thickness of only about 2–3 $\mu$m. These thin conductors can be too resistive for high speed testing. The resistance can be lowered by widening the conductors but this greatly increases capacitance and causes speed delays.

Another limitation of deposited metal conductors for interconnects, is that low resistivity materials are sometimes difficult to utilize in conventional semiconductor fab shops. Copper, for example, is an unwanted contaminant for some semiconductor fabrication processes such as CVD and is preferable to avoid.

Another type of interconnect, as described in U.S. Pat. No. 5,487,999 to Farnworth, includes a rigid substrate such as silicon, but with contact members formed separately from the substrate. With this type of interconnect, the contact members can comprise metal microbumps mounted on a multi layered tape similar to TAB tape. The tape can also include conductors formed of copper foil or other highly conductive, relatively thick metal. The microbumps can be formed directly on the conductors or contained in vias formed in the tape.

Interconnects formed with microbump contact members and multi layered tape can include highly conductive conductors formed of copper foil or other relatively thick metal. However, during burn in testing temperature cycles of 200° C. or more can occur. The difference in the coefficients of thermal expansion (CTE) between the conductors and a substrate material such as silicon, can generate thermal stresses in the interconnect. In addition, thermal expansion can cause the conductors to shift relative to the substrate. If the contacts members are formed in direct contact with the conductors, movement of the conductors can displace the location of the contact members.

The present invention is directed to a hybrid interconnect having contact members formed integrally with the substrate but with conductors formed on a multi layered tape. The multi layered tape can be formed separately from the interconnect substrate and then bonded to the interconnect substrate with the conductors in electrical communication with the contact members. This allows low resistivity conductors to be used without requiring deposition of metals such as copper that can be detrimental to other semiconductor fabrication processes. In addition, with the present interconnect the location of the contact members can be fixed on the substrate while thermal stresses between the conductors and substrate can be absorbed by expansion joints.

SUMMARY OF THE INVENTION

In accordance with the invention, an improved interconnect for making electrical connections with a semiconductor die, a method for fabricating the interconnect, and a test system including the interconnect are provided. The interconnect includes a substrate with integrally formed contact members, and a pattern of conductors formed on a multi layered tape bonded to the substrate. The substrate can be silicon and the contact members formed in dense arrays using semiconductor fabrication processes, such as etching and metallization processes. The bonded tape provides improved electrical characteristics including lower resistivity and impedance matching of the conductors with testing circuitry.

The contact members extend above the conductors and are configured to electrically contact corresponding contact locations (e.g., bond pads) on the die. In the illustrative embodiment the contact members comprise raised pillars etched on the substrate and covered with conductive layers. The contact members can also include penetrating projections configured to penetrate the contact locations on the die to a limited penetration depth. The conductors are configured to provide electrical paths to and from the contact members for electrical signal transmission.

The multi layered tape can include a polymer film (e.g., polyimide) laminated with a pattern of metal conductors. Advantageously, the metal conductors can be formed of low resistance copper foil, or other highly conductive, relatively thick material. In addition, the tape can include a ground or voltage plane to allow an impedance of the conductors to match that of the testing apparatus or testing circuitry. Still further, an electrically insulating adhesive layer can be formed between the tape and the substrate. The adhesive layer and tape, in addition to providing electrical insulation, absorb thermal stresses generated by expansion of the conductors relative to the substrate.

For forming an electrical connection between the contact members and conductors, the conductors can be etched with patterns of openings that correspond to the patterns of contact members on the substrate. The contact members can be placed into the openings, extending above the conductors, and a conductive material placed in the gap therebetween. The conductive material can comprise a resilient conductive adhesive or a solder alloy. The conductive material in addition to forming an electrical path, also functions as an expansion joint, to accommodate thermal expansion of the conductors without stressing the contact members. The contact members can also include bases formed by stepped portions of the substrate. The bases raise the tips of the contact members with respect to the surface of the substrate, and facilitate formation of the electrical connections between the contact members and conductors.

A system for testing semiconductor dice can include a temporary package for containing the interconnect and a single unpackaged die. The temporary package can include a base and a force applying mechanism for biasing the die and interconnect together. The interconnect establishes temporary electrical communication with the die, and provides conductive paths to and from contact locations on the die to terminal contacts on the package base. The terminal contacts can be placed in electrical communication with a test apparatus such as a burn in board, configured to apply test signals to the integrated circuits on the die.

An alternate embodiment system can include an interconnect formed as a probe card configured for testing semiconductor dice contained on a wafer. The wafer can be an entire semiconductor wafer or portion of a wafer or other semiconducting substrate. A conventional testing apparatus such as a wafer probe handler can be used to support and bias the probe card and wafer together during the testing procedure.

DETAILED DESCRIPTION OF THE PREFERRED EMBODIMENTS

Referring to FIGS. 1–4, an interconnect 10 constructed in accordance with the invention is shown. The interconnect 10 (FIG. 1) includes a substrate 12 (FIG. 2) and a multi layered tape 14 (FIG. 2) bonded to the substrate 12. The multi layered tape 14 includes a polymer film 16 (FIG. 2) and a pattern of conductors 18. The interconnect 10 is herein referred to as a "hybrid" because the substrate 12 and multi layered tape 14 can be formed separately and then assembled. This improved the electrical characteristics of the interconnect 10 particularly the resistivity and impedance of conductive paths on the interconnect 10.

Figures 1, 2, 3:
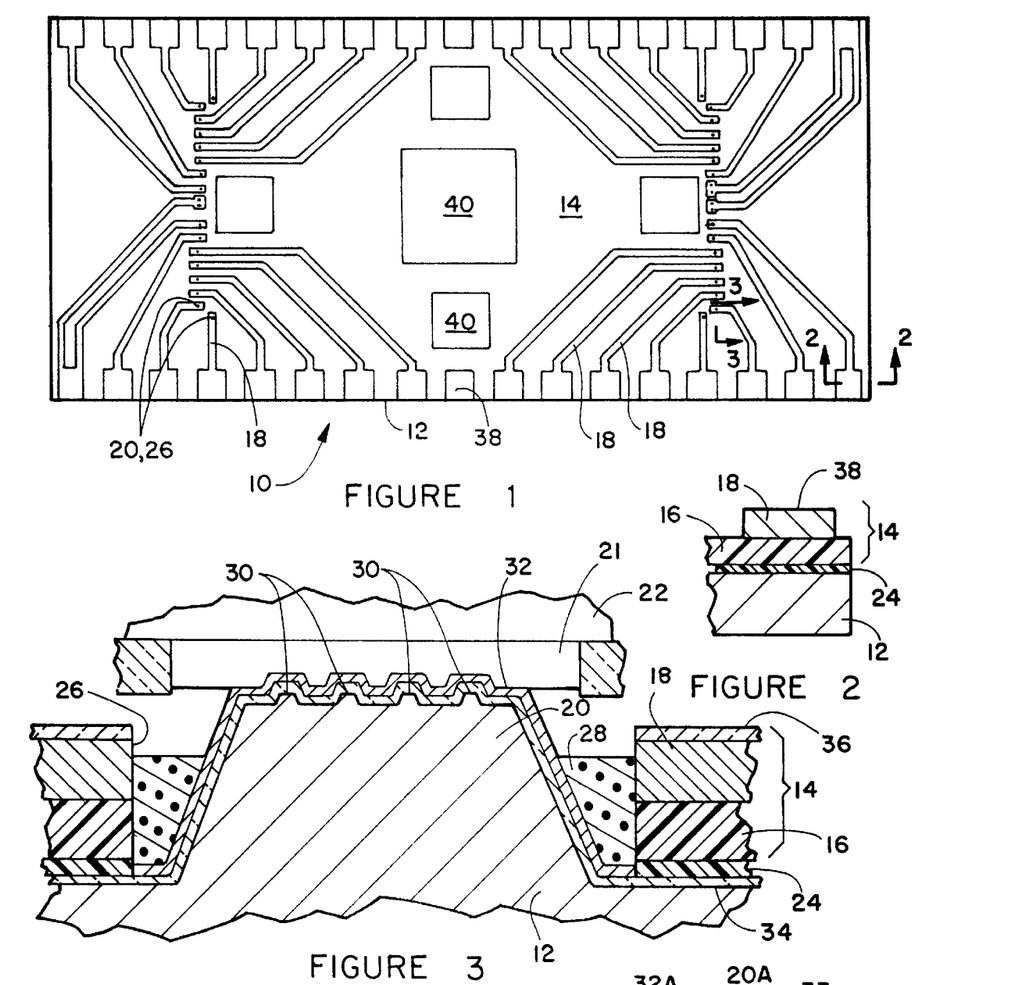
FIG. 1 is a plan view of an interconnect constructed in accordance with the invention.
FIG. 2 is an enlarged cross sectional view of the interconnect taken along section line 2—2 of FIG. 1.
FIG. 3 is an enlarged cross sectional view taken along section line 3—3 of FIG. 1 illustrating a contact member for the interconnect in electrical communication with a contact location on a semiconductor die.

The substrate 12 can be formed of a material such as silicon, silicon-on-glass, silicon-on-sapphire, germanium, ceramic, or photomachinable glass. In general, these materials are rigid and provide a good CTE match with a silicon die. The substrate 12 includes patterns of contact members 20 (FIG. 3) placed in electrical communication with the conductors 18 on the tape 14 during assembly of the interconnect 10.

The contact members 20 (FIG. 3) are formed in patterns on the substrate 12 that match corresponding patterns of contact locations 21 (FIG. 3) on a semiconductor die 22 (FIG. 3). The contact members 20 (FIG. 3) are configured to establish temporary electrical communication with the contact locations 21 (FIG. 3) such as for testing the die 22. Typically, the contact locations 21 (FIG. 3) on the die 22 will be thin film bond pads, test pads, or fuse pads in electrical communication with the semiconductor devices and integrated circuits formed on the die 22.

As will be further explained, the contact members 20 (FIG. 3) can be formed integrally with the substrate 12 by etching the substrate 12. In addition, each contact member 20 can include one or more penetrating projections 30 (FIG. 3) configured to penetrate the contact locations 21 on the die 22 to a limited penetration depth. Each contact member 20 can also include a conductive layer 32 (FIG. 3) formed of a metal or metal silicide. An insulating layer 34 (FIG. 3) can be formed over the substrate 12 to electrically insulate the conductive layers 32 from the substrate 12. For a substrate 12 formed of silicon, the insulating layer 34 can be $SiO_2$.

The multi layered tape 14 (FIG. 2) can be similar to TAB tape used in the semiconductor industry for packaging semiconductor dice. TAB tape is commercially available from manufacturers such as 3M, Shinko, Nitto Denko, and Packard Hughes. The polymer film 16 (FIG. 2) for the multi layered tape 14 can comprise an electrically insulating polymeric material, such as polyimide. The conductors 18 (FIG. 2) for the multi layered tape 14 can comprise a metal foil, such as copper, patterned as required by punching or etching, and laminated to the polymer film 16 (FIG. 2). Lamination of the conductors (FIG. 2) to the polymer film 16 can be with heat, pressure and adhesives (not shown). Furthermore, the conductors 18 can include exposed bonding pads 38 (FIG. 1) formed along peripheral edges of the substrate 12. As will be further explained, the bonding pads 38 can be used during a subsequent wire bonding process to provide conductive paths from test circuitry to the conductors 18.

The multi layered tape 14 can also include a ground or voltage plane formed of a metal layer (not shown) embedded in the polymer film 16 at a predetermined distance with respect to the conductors 18. This permits an impedance of the conductors 18 to be matched to an impedance of other electrical components of a testing system (e.g., testing circuitry).

An adhesive layer 24 (FIG. 2) can be formed between the polymer film 16 and the substrate 12 for securing the multi layered tape 14 to the substrate 12. The adhesive layer 24 can be formed of an electrically insulating material such as silicone. One suitable adhesive is "ZYMET" silicone elastomer manufactured by Zymet, Inc., East Hanover, N.J. As will be further explained, the adhesive layer 24 also functions as a thermal expansion joint between the multi layered tape 14 and substrate 12.

The multi layered tape 14 can include patterns of openings 26 (FIG. 3) that correspond to the patterns of the contact members 20 (FIG. 3) on the substrate 12. The openings 26 can extend completely through the conductors 18 and through the polymer film 16. As shown in FIG. 3, an electrically conductive material 28, can be placed within the openings 26 to establish electrical communication between the conductive layers 32 of the contact members 20 and the conductors 18 of the multi layered tape 14.

The conductive material 28 can be a conductive adhesive such as a metal filled epoxy (e.g., silver epoxy) or other material that is conductive in any direction. Alternately, the conductive material 28 can be an anisotropic conductive adhesive formed such that electrical resistance in one direction will differ from that measured in another direction. For example, X-axis and Z-axis anisotropic adhesives are filled with conductive particles to a low level such that the particles do not contact each other in selected planes. Curing is typically accomplished by compression of the adhesive along the direction of conduction.

The conductive material 28 can be formed as a viscous paste or as a film that is applied and then cured to harden. For example, conductive adhesives are commercially available in a thermal plastic, or thermal setting, paste or film. Thermal plastic conductive adhesives are heated to soften for use and then cooled for curing. Thermal setting conductive adhesives require heat curing at temperatures from 100–300° C. for from several minutes to an hour or more. Suitable conductive adhesives are sold under the trademarks: "X-POLY" and "Z-POXY", by A.I. Technology, Trenton, N.J.; and "SHELL-ZAC", by Sheldahl, Northfield, Minn. Conductive adhesives are also sold by 3M, St. Paul, Minn.

The conductive material 28 can be formed by deposition into the openings 26 (FIG. 3) using a suitable dispensing process, such as from a syringe or nozzle. Screen printing and stenciling can also be used. Once cured, the conductive material 28 (FIG. 3) electrically connects the conductive layers 32 (FIG. 3) for the contact members 20 to the conductors 18 (FIG. 3) for the multi layered tape 14.

In addition, with the conductive material 28 formed of a conductive adhesive, the material can be selected to provide a resilient expansion joint between the contact members 20 and conductors 18. With the contact members 20 formed of silicon and the conductors 18 formed of copper, the conductive material 28 allows the conductors 18 to shift without stressing and changing the location of the contact members 20. In a similar manner, the electrically insulating adhesive layer 24 (FIG. 3) and polymer film 16 form expansion joints between the conductors 18 and the bulk of the substrate 12.

Figure 4:
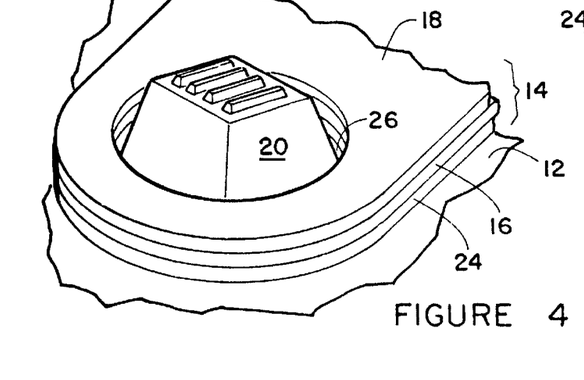
FIG. 4 is an enlarged schematic perspective view of the contact member illustrating the electrical connection with a conductor of the interconnect.

As shown in FIG. 4, each contact member 20 can be sized to extend through a corresponding opening 26 in the multi layered tape 14. In addition, the openings 26 can be formed with a diameter that is larger than the width of the contact members 20 to provide an annular gap for retaining the conductive material 28 (FIG. 3). In FIG. 4, the conductive material 28 is omitted for clarity.

The height of the contact members 20 and the thickness of the multi layered tape 14 can be selected such that the contact members 20 extend above the surface of the conductors 18 and are free to contact the contact locations 21 (FIG. 3) on the die 22 without interference from the tape 14. By way of example and not limitation, the contact members 20 can be formed with a height of from 50–100 $\mu$m, a width of about 50–100 $\mu$m, and a spacing of about 50–100 $\mu$m. The conductors 18 for the multi layered tape 14 can be formed with a thickness of about 10–20 $\mu$m. The difference between the height of the contact members 20 and the thickness of the tape 14 is approximately equal to the distance between the tips of the contact members 20 and the surface of the conductors 18. The polymer film can be formed with a thickness of about 10–20 $\mu$m. The adhesive layer 24 can be formed with a thickness of about 5–20 $\mu$m. The openings 26 can be formed with a diameter of from about 60 to 100 $\mu$m.

Figure 4A:
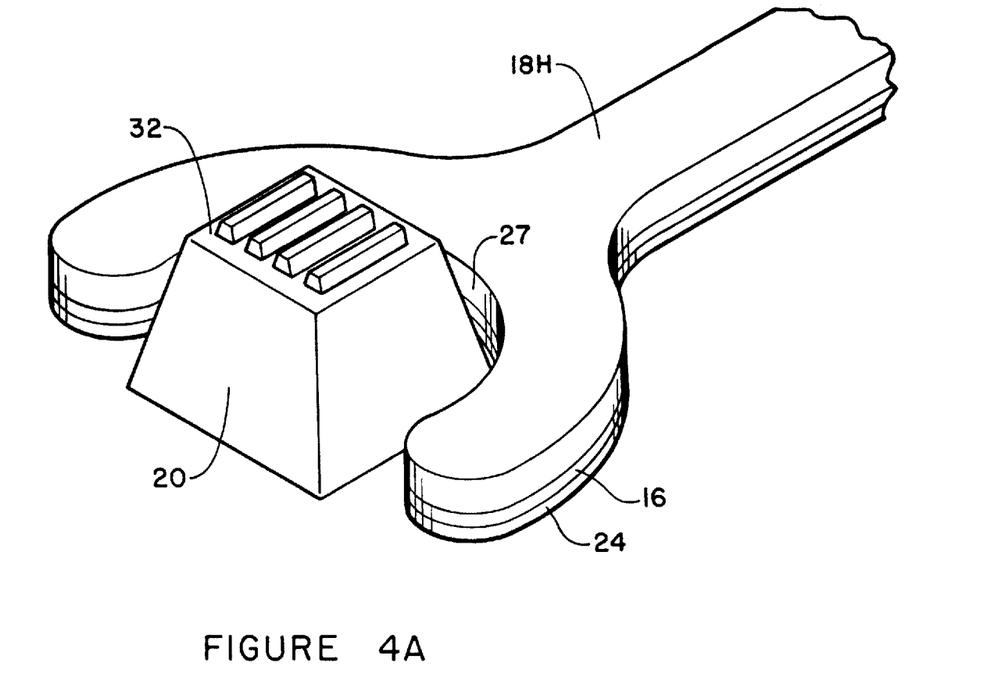
FIG. 4A is an enlarged schematic perspective view of the contact member illustrating an alternate electrical connection.
Figure 4B:
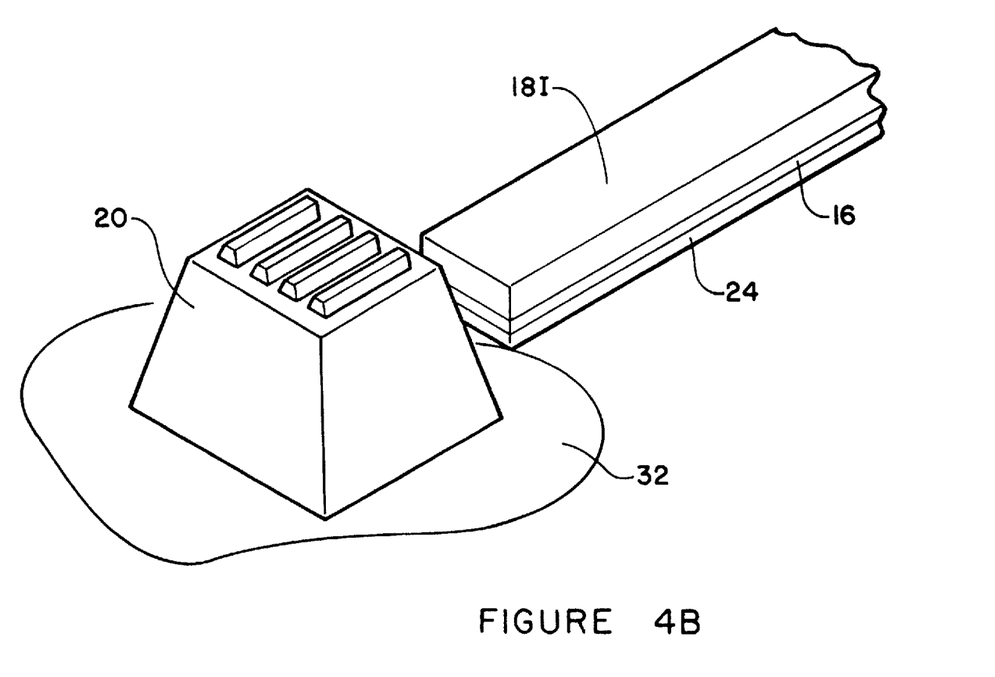
FIG. 4B is an enlarged schematic perspective view of the contact member illustrating another alternate electrical connection.

As shown in FIG. 4A, a conductor 18H can be configured to enclose just a portion of the contact member 20. A gap 27 between the conductor 18H and the conductive layer 32 for the contact member 20 can be filled with a conductive adhesive (not shown). As shown in FIG. 4B, a conductor 18I can be configured to overlap the conductive layer 32 for the contact member 20. A conductive adhesive (not shown) can be used to electrically connect the conductive layer 32 to the conductor 18I.

In FIG. 3, the multi layered tape 14 is shown in a configuration with the conductors 18 on top (i.e., exposed) and the polymer film 16 subjacent to the conductors 18. However, the multi layered tape 14 can also be mounted to the substrate 12 with the polymer film 16 on top and the conductors 18 subjacent to the polymer film 16 (not shown). In addition, with exposed conductors 18, if desired, an additional insulating layer 36 (FIG. 3) can be formed over the conductors 18. The insulating layer 36 can be a dielectric material deposited on the conductors 18 to a desired thickness.

In addition, alignment fiducials 40 (FIG. 1) can be formed on the multi layered tape 14. The alignment fiducials 40 can be used in a subsequent alignment process wherein the contact members 20 (FIG. 3) are aligned with the contact locations 21 (FIG. 3) using optical elements associated with an optical alignment system.

Figure 3A:
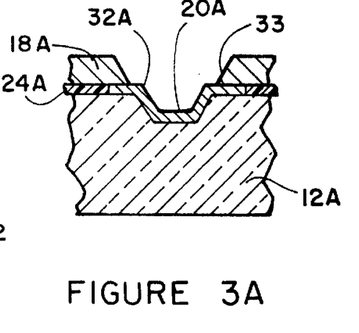
FIG. 3A is an enlarged cross sectional view equivalent to FIG. 3 but illustrating an alternate embodiment contact member for a die having a bumped contact location.

Referring to FIG. 3A, an alternate embodiment contact member 20A is shown. The contact member 20A is configured to provide temporary electrical communication with a bumped contact location such as a solder bump on a bumped die (not shown). The contact member 20A can be formed on a substrate 12A having a depression (indentation) formed therein. The substrate 12A can be formed of ceramic, silicon or other material. In addition, a conductive layer 32A can be formed on the substrate 12A within the depression. A conductor 18A can be bonded to the substrate 12A in electrical communication with the conductive layer 32A. An adhesive layer 24A can be used to bond the conductor 18A to the substrate 12A.

The contact member 20A can be formed by laser drilling, punching, etching or similarly forming, concave depressions in the substrate 12A. The conductive layer 32A can then be formed in the depressions using a suitable deposition process. The conductors 18A can also include an opening 33 formed by etching or other subtractive process. The conductive layer 32A and opening 33 can be sized and shaped to retain the bumped contact location. Conventionally formed solder bumps on a bumped die will have a diameter of from 5 mil to 30 mil. Accordingly, the concave depression in the substrate 12A and the opening 33 in the conductor 18A can be formed with diameters in this size range.

Figure 5A:
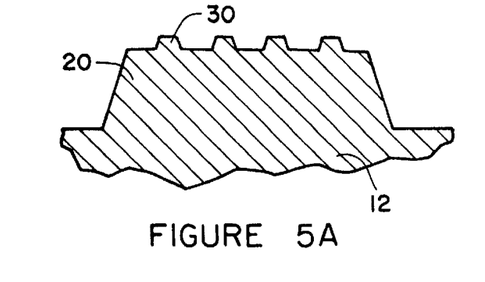
FIGS. 5A–5C are enlarged schematic cross sectional views illustrating steps in a method for forming a contact member on a substrate of the interconnect.
Figure 5B:
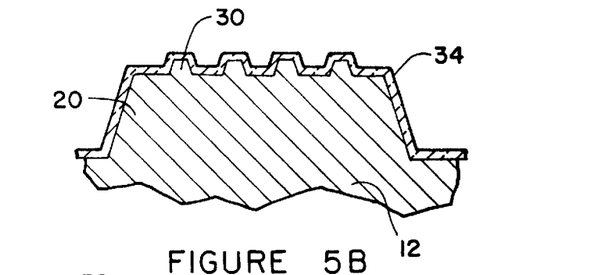
Figure 5C:
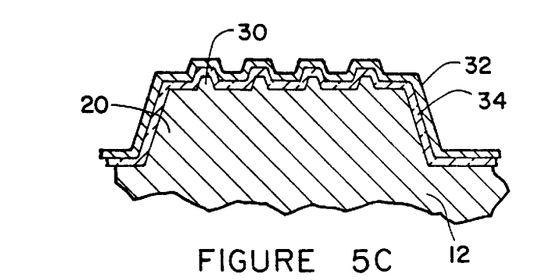

Referring to FIGS. 5A–5C, a method for forming the raised contact members 20 (FIG. 3) is shown. In the process illustrated in FIGS. 5A–5C, the interconnect substrate 12 comprises silicon or other etchable semiconductor material.

Initially, as shown in FIG. 5A, the penetrating projections 30 can be formed by forming a mask (not shown) on the substrate 12 and then etching exposed portion of the substrate 12 through the mask. For example, a hard mask can be formed on the substrate 12 by depositing a layer of silicon nitride ($Si_3N_4$) and then patterning the silicon nitride layer using hot phosphoric acid. A wet or dry, isotropic or anisotropic, etch process can then be used to etch through openings in the hard mask to form the projections 30. For example, an anisotropic etch can be performed on a substrate 12 formed of silicon using a solution of KOH and $H_2O$. This type of semiconductor fabrication process is sometimes referred to as "bulk micromachining".

The projections 30 can be elongated blades or sharp points formed in locations that match the placement of the contact locations 21 (FIG. 3) on the die 22. In the illustrative embodiment, there are four projections 30 per contact member 20. However, a greater or lesser number of projections 30 can be formed. In addition, the projections 30 for each contact member 20 are formed in a pattern having an outline contained within the perimeter of the contact locations 21 (FIG. 4) on the die 22. A representative height for the projections 30 measured from the base to the tip can be from 0.1 to 1 μm. A representative length for the projections 30 measured from end to end can be from 3 to 10 μm. The size of the projections 30 insures that the projections do not penetrate through the contact locations 21 (FIG. 3), which are typically about 2000 to 15,000 Å thick. In addition, a top surface of the contact members 20 provide a stop plane to limit the penetration depth.

Once the projections 30 are formed, the hard mask can be stripped and another mask (not shown) can be formed for etching the substrate 12 to form the contact members 20. Using an anisotropic etch process, the contact members 20 can be formed as topographically elevated pillars generally conical in shape. A representative height of the contact members 20 from base to tip can be from 50–100 μm. The contact members 20 thus have a height that is from 50 to 1000 times greater than the height of the penetrating projections 30.

A representative width of each side of the contact members 20 can be from 40–80 μm. In use, the contact members 20 separate the substrate 12 from the die 22 (FIG. 3). This separation distance functions to clear particulate contaminants on the opposing surfaces that could cause shorting. The separation distance also functions to diminish cross talk between the die 22 and the substrate 12 during the test procedure. Following formation of the contact members 20, the etch mask can be stripped.

Suitable etch processes for forming the contact members 20 and projections 30 substantially as shown in FIG. 5A are also disclosed in U.S. Pat. Nos. 5,326,428; 5,419,807 and 5,483,741 which are incorporated herein by reference.

Referring to FIG. 5B, once the projections 30 and contact members 20 have been formed, the insulating layer 34 can be formed over the entire substrate 12 including over the contact members 20 and projections 30. The insulating layer 34 can be a grown or deposited material such as $SiO_2$ or $Si_3N_4$. A representative thickness for the insulating layer 34 can be from 500 Å to 1 μm.

Following formation of the insulating layer 34 and as shown in FIG. 5C, the conductive layers 32 for the contact members 20 can be formed on the insulating layer 34. The conductive layers 32 for all of the contact members 20 can be a same layer of material that has been patterned to cover just the contact members 20 and selected portions of the substrate 12. To form the conductive layers 32, a highly conductive metal can be blanket deposited on the substrate 12 by sputtering or other deposition process. Exemplary metals include aluminum, platinum, palladium, copper, gold and silver or alloys of these metals. A representative thickness for the conductive layers 32 can be from 500 Å to 2 μm. Some of these metals, particularly gold and platinum, are non-reactive such that material transfer between the conductive layers 32 and contact locations 21 (FIG. 3) can be minimized. The conductive layers 32 can also comprise a bi-metal stack comprising a base layer and a non-reactive outer layer.

Following blanket deposition of the desired conductive metal, a resist mask can be formed and used for etching the conductive metal such that at least a portion of the contact members 20 remain covered with the conductive layers 32. The resist mask can be deposited using a standard photoresist deposition and exposure process. This can include spin deposition, followed by hardening, exposure and development. U.S. Pat. No. 5,607,818 incorporated herein by reference describes a method for patterning a conductive layer using an electrophoretically deposited layer of resist.

As an alternative to a metallization process (i.e., depositing resist, forming mask, etching), the conductive layers 32 can be formed as a metal silicide using a process as disclosed in U.S. Pat. No. 5,483,741 incorporated herein by reference.

Figure 6A:
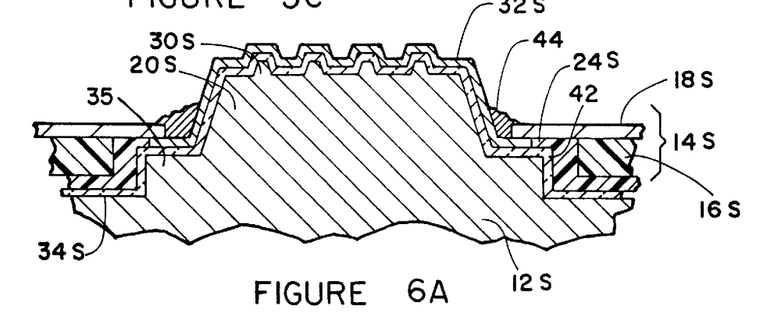
FIG. 6A is an enlarged schematic cross sectional view illustrating an alternate embodiment stepped contact member and an electrical connection to conductors attached to the substrate.

Referring to FIG. 6A, alternate embodiment contact members 20S and stepped substrate 12S are illustrated. The stepped substrate 12S includes steps 42 which forms a base 35 for each contact member 20S. A conductive layer 32S can also be formed on each contact member 20S as previously described. In addition, an insulating layer 34S for the substrate 12S and an adhesive layer 24S for securing a multi layered tape 14S to the substrate 12S can be formed as previously described. The adhesive layer 24S can be formed to follow the contour of the steps 42. This configuration further spaces the surface of the multi layered tape 14S from the penetrating projections 30S and allows the contact members 20S to project by a greater distance.

An electrical connection between the conductors 18S on the multi layered tape 14S and the conductive layers 32S on the contact members 20S can be formed using a conductive adhesive as previously described, or with a solder bead 44. In addition, the conductors 18S for the multi layered tape 14S can overhang from an edge of a polymer film 16S to overlap the conductive layers 32S and facilitate formation of the solder beads 44. In this embodiment the conductors 18S and conductive layers 32S can be formed of a solder wettable metal. The solder bead 44 can comprise tin-lead or other solder alloy applied by wave soldering, reflowing or other process. For example, solder can be screen printed or electroplated in desired locations on the conductors 18S of the multi layered tape 14S. The tape 14S can then be applied to the substrate 12S and the solder reflowed.

Figure 6B:
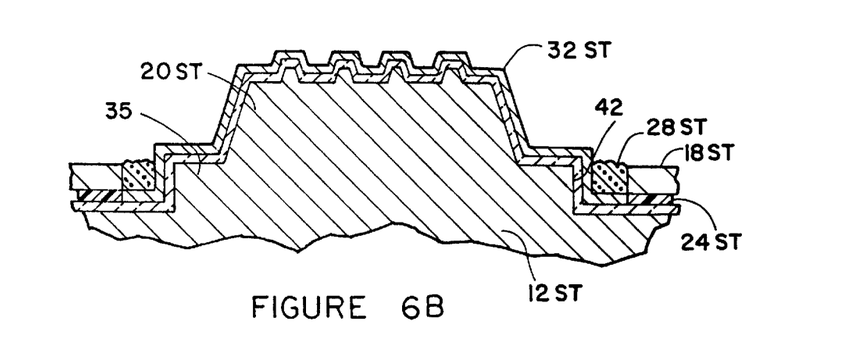
FIG. 6B is an enlarged schematic cross sectional view illustrating the alternate embodiment stepped contact member and an alternate electrical connection to conductors attached to the substrate.

Referring to FIG. 6B, another alternate embodiment interconnect with stepped contact members 20ST is illustrated. The stepped contact members 20ST are formed as previously described for stepped contact members 20S to include bases 35 and steps 42. However, in this embodiment the conductive layers 32ST for the contact members 20ST follow the contour of the steps 42. In addition, the conductors 18ST can be attached directly to the substrate 12ST using an electrically insulating adhesive layer 24ST. The conductors 18ST can be a patterned metal foil as previously described but in this case are not mounted to a polymer film. An electrical connection between the conductors 18ST, and the conductive layers 32ST for the contact members 20ST, can be formed by a conductive material 28ST such as a conductive adhesive formed substantially as previously described for conductive material 28 (FIG. 2).

Figure 7A:
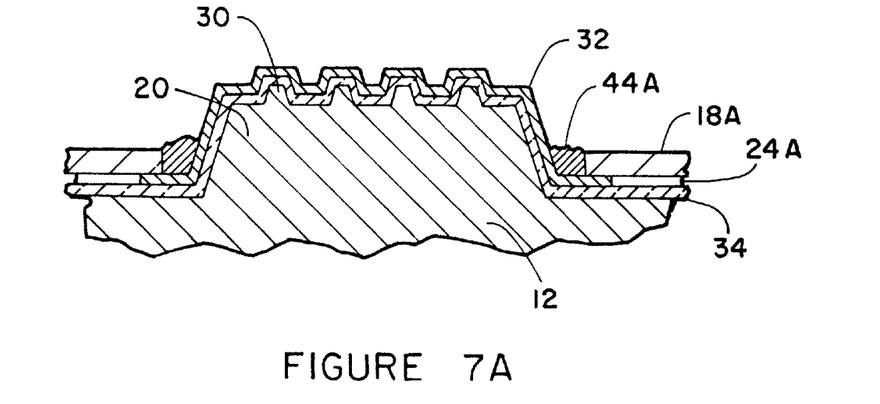
FIGS. 7A–7E are enlarged cross sectional views of the contact member illustrating various electrical connections to the contact member.

FIG. 7A illustrates an alternate embodiment wherein the contact members 20 are formed as previously described. In this embodiment the conductors 18A are bonded to the substrate 12 rather than being mounted to a polymer film. An electrically insulating adhesive layer 24A can be used to bond the conductors 18A to the substrate 12. In addition, solder beads 44A can be used to electrically connect the conductive layers 32 for the contact members 20 to the conductors 18A. The solder beads 44A can be formed of a suitable alloy applied as previously described. As with the embodiment of FIG. 6A, the conductive layers 32 and the conductors 18A can be formed of a solder wettable metal.

Figure 7B:
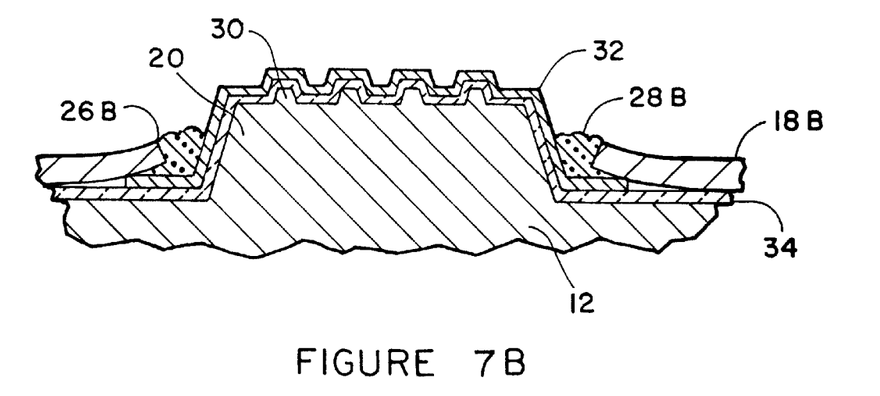

FIG. 7B illustrates an alternate embodiment wherein the contact members 20 are formed as previously described but the conductors 18B are mounted directly on the insulating layer 34 for the substrate 12. In this embodiment, the conductors 18B can comprise a patterned metal foil as previously described. In addition, the conductors 18B can include patterns of openings 26B for the contact members 20. A conductive material 28B can be placed on the bases of the conductive layers 32 to form the electrical connection between the conductors 18B and the conductive layers 32 for the contact members 20.

Figure 7C:
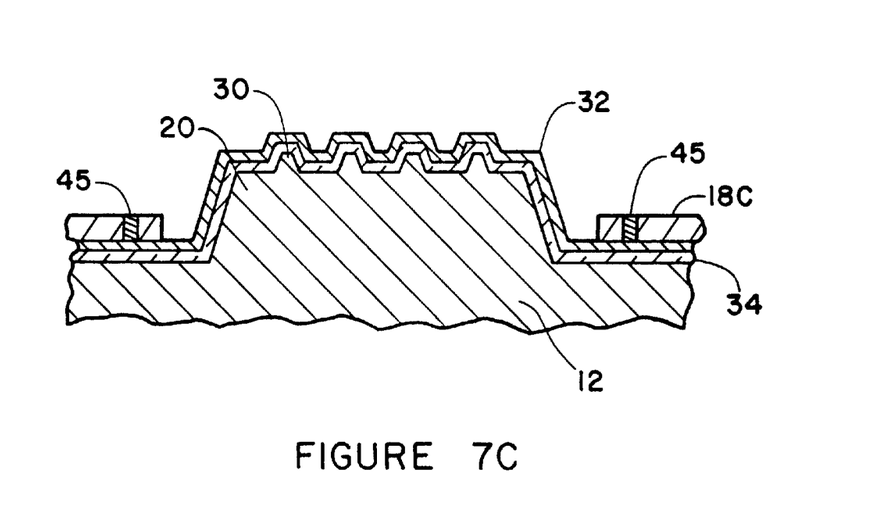

FIG. 7C illustrates an alternate embodiment wherein the contact members 20 are formed as previously described. In this embodiment the conductors 18C include solder filled vias 46. The solder filled vias 46 can be formed by etching or otherwise forming openings in the conductors 18C and then plating or otherwise depositing solder into the openings. The conductors 18C can then be placed onto the substrate as required and the solder filled vias 46 reflowed onto the conductive layers 32 to electrically connect the conductors 18C to the contact members 20.

Figure 7D:
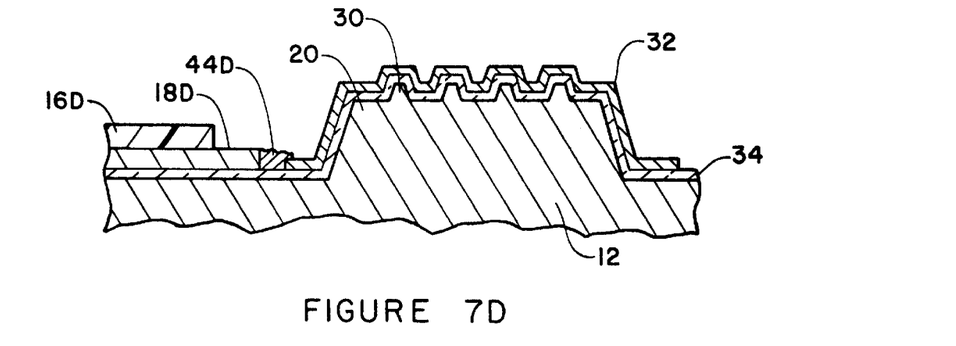

FIG. 7D illustrates an alternate embodiment wherein the contact members 20 are formed as previously described. In this embodiment the conductors 18D are not directly bonded to the substrate 12 and are free to move with temperature changes. A solder bead 44D electrically connects the conductors 18D to the conductive layers 32 for the contact members 20. In addition, the conductors 18D attached to an exposed polymer film 16D.

Figure 7E:
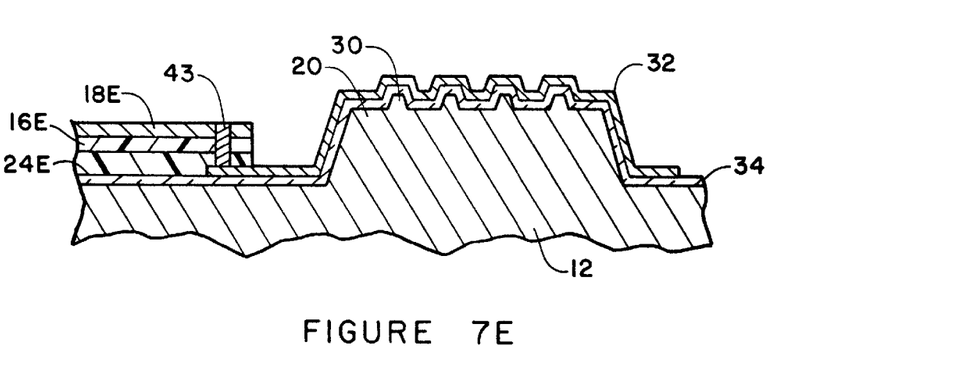

FIG. 7E illustrates an alternate embodiment wherein the contact members 20 are formed as previously described. In this embodiment the conductors 18E are attached to a polymer film 16E. The polymer film 16E is attached to the substrate 12 with an adhesive layer 24E. The electrical connection between the conductors 18E and the conductive layers 32 for the contact members 20 is formed by metal pins 43. The metal pins 43 can be formed of nickel or other metal bonded to the conductors 18E. In addition, the metal pins 43 can be configured to scrub across and penetrate into the conductive layers 32. Also in this embodiment a solder bead (not shown) can be formed between the metal pins 43 and conductive layers 32.

Figure 8A:
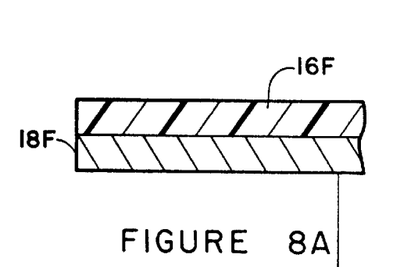
FIGS. 8A–8D are schematic cross sectional views illustrating steps in a method for applying solder to tape having conductors thereon.
Figure 8B:
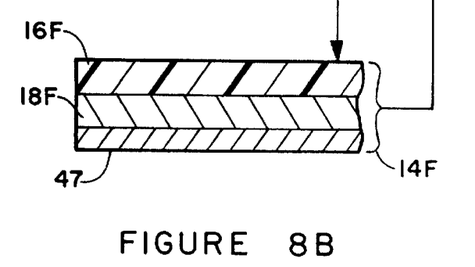
Figure 8C:
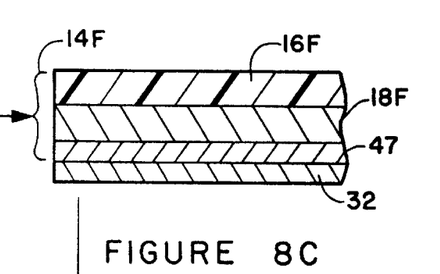
Figure 8D:
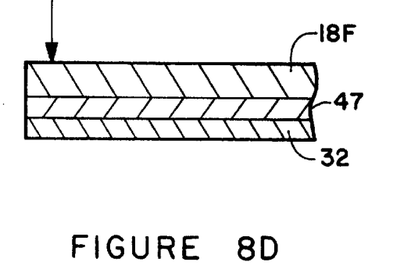

Referring to FIGS. 8A–8D, a method for forming and bonding conductors 18F to the substrate 12 (FIG. 1) is shown. Initially, as shown in FIG. 8A, a polymer film 16F is bonded to the conductors 18F and holds the conductors 18F in place during the fabrication process. The polymer film 16F can be polyimide and the conductors 18F can be copper foil patterned as required. Next, as shown in FIG. 16B, a solder layer 47 is plated onto the exposed surfaces of the conductors 18F to form a solder tape 14F. This can be accomplished using an electrodeposition process with a wet solder bath. Next, as shown in FIG. 16C, the solder tape 14F is placed onto the substrate 12 (FIG. 1) so that the solder layer 47 contacts the conductive layers 32 for the contact members 20 (FIG. 1). The solder layer 47 can then be reflowed. Next, as shown in FIG. 8D the polymer film 16F can be removed.

Figures 9A, 9B:
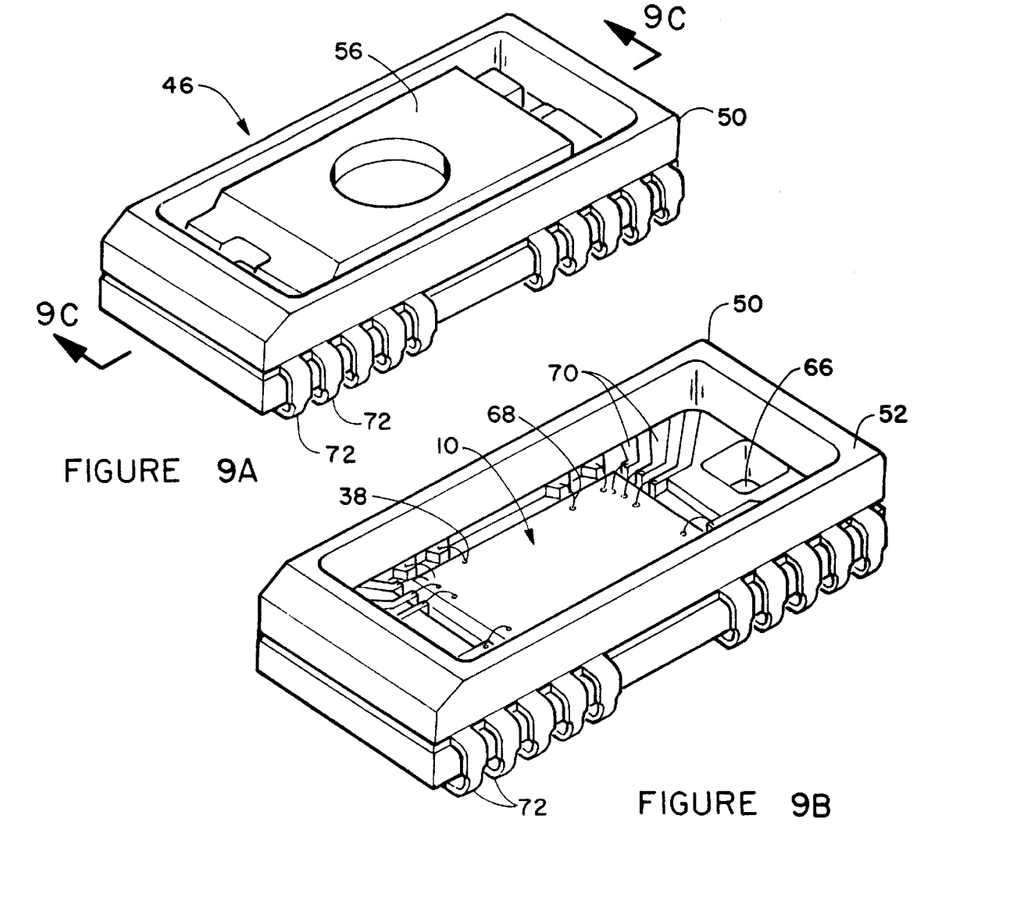
FIG. 9A is a perspective view of a system for testing a semiconductor die in accordance with the invention including a temporary package for housing the die and the interconnect.
FIG. 9B is a perspective view of the temporary package with a cover and force applying mechanism removed.
Figure 9C:
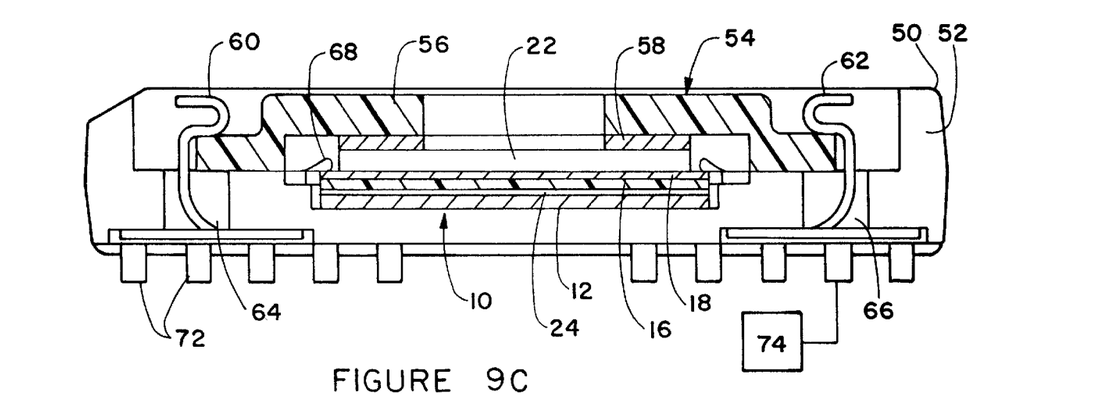
FIG. 9C is a cross section view of the temporary package taken along section line 9C—9C of FIG. 9A.

Referring to FIGS. 9A–9C, a test system 46 utilizing the interconnect 10 is illustrated. The test system 46 includes a temporary package 50 for housing the die 22 (FIG. 9C) for test procedures such as burn-in testing. The interconnect 10 mounts to the temporary package 50 and establishes temporary electrical communication with the die 22.

The temporary package 50 includes a package base 52 (FIG. 9B) and a force applying mechanism 54 (FIG. 9C). The temporary package 50 can be formed with an outline that is substantially equivalent to the outline of a conventional semiconductor package. This allows conventional testing apparatus such as burn in boards to be used with the temporary package 50.

The force applying mechanism 54 secures the die 22 to the package base 52 and presses the die 22 against the interconnect 10. The force applying mechanism 54 includes a cover 56 (FIG. 9C) and a spring 58 (FIG. 9C). The spring 58 can be formed of metal or of an elastomeric material. The package 10 also includes a latching mechanism in the form of clips 60, 62 (FIG. 9C) which secure the force applying mechanism 54 to the package base 52. The clips 60, 62 attach to corresponding openings 64, 66 (FIG. 9C) in the package base 52. As shown in FIG. 9B, the bonding pads 38 on the interconnect 10 can be wire bonded to conductive traces 70 on the package base 14 using bond wires 68. The conductive traces 70 are in electrical communication with terminal contacts 72 formed on the package base 50.

Further details of the temporary package 50 are disclosed in U.S. patent application Ser. No. 08/580,687 incorporated herein by reference. The cited patent application also describes a method for optically aligning the contact members 20 (FIG. 3) to the contact locations 21 (FIG. 3) on the die 22. The alignment fiducials 40 (FIG. 1) formed on the interconnect 10 can be used to facilitate the alignment process.

For testing the die 22, the terminal contacts 72 on the temporary package 50 can be placed in electrical communication with testing circuitry 74 (FIG. 9C). For example, the temporary package 50 can be placed on a burn in board or other testing apparatus in electrical communication with the testing circuitry 74. Test signals can then be applied through the terminal contacts 72 on the temporary package 50, and through the contact members 20 (FIG. 3) on the interconnect 10 to the die 22.

Thus an improved interconnect 10 (FIG. 1) and system 46 (FIG. 9A) are provided. Because the interconnect 10 includes low resistance metal conductors 18 (FIG. 3), a low resistance electrical path is provided to the contact members 20 (FIG. 3) for high speed testing. In addition, with the conductive material 28 (FIG. 3) formed as a conductive adhesive, or other resilient material, an expansion joint is formed. The expansion joint absorbs thermal stresses between the conductors 18 (FIG. 3) and the contact members 20 (FIG. 3). Furthermore, thermal stresses between the conductors 18 (FIG. 3) and the substrate 12 (FIG. 3) can be absorbed by the polymer film 14 (FIG. 3) and the adhesive layer 24 (FIG. 3).

Still further, because the conductors 18 (FIG. 3) can be formed separately than the substrate 12 (FIG. 3), rather than using a depositing process such as CVD, contaminant metals such as copper, will not be introduced into other semiconductor fabrication processes. On the other hand, the contact members 20 (FIG. 3) can be formed integrally with the substrate 12 and in dense arrays using semiconductor circuit fabrication processes. In addition, with the substrate 12 and contact members 20 formed of silicon, the thermal expansion of the substrate 12 and contact members 20 can match the thermal expansion of the die 22.

Figure 10A:
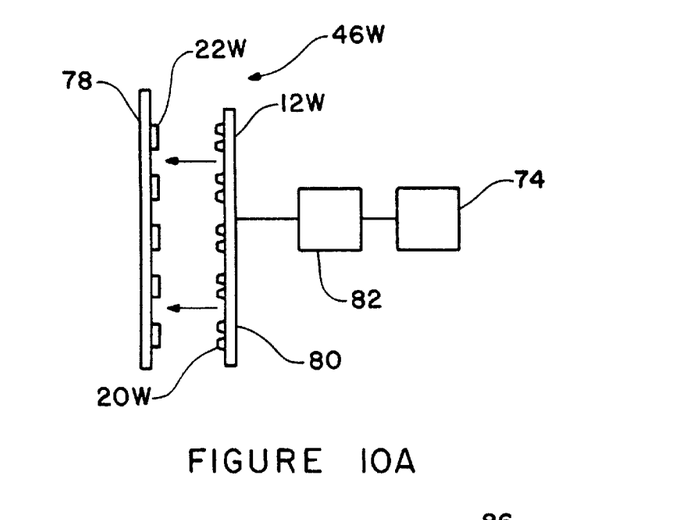
FIGS. 10A–10B are schematic views of a system constructed in accordance with the invention for testing dice contained on a semiconductor wafer.
Figure 10B:
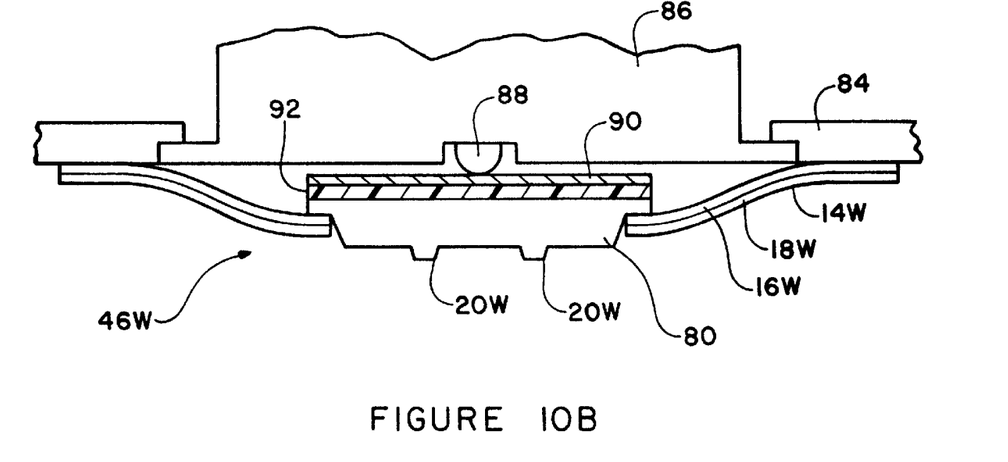

Referring to FIGS. 10A and 10B, a wafer level system 46W for testing dice 22W contained on a semiconductor wafer 78 is shown. The wafer level system 46W includes a probe card 80 and a wafer probe handler 82. The probe card 80 includes contact members 20W formed on a substrate 12W substantially as previously described for contact members 20 (FIG. 1). The contact members 20W are formed in patterns that match corresponding patterns of contact locations on the dice 22W. The probe card 80 can be configured to test a desired number of dice 22W at the same time (e.g., 8, 16) up to all of the dice contained on the wafer 78.

As shown in FIG. 10B, the probe card 80 also includes a multi layered tape 14W comprising a polymer film 16W and conductors 18W formed substantially as previously described. In this embodiment the multi layered tape 14W establishes electrical communication with the contact members 20W. In addition, the multi layered tape 14W physically attaches the probe card 80 to a probe card fixture 84. The probe card fixture 84 mounts to the wafer probe handler 82 and is configured for electrical communication with the testing circuitry 74. The probe card fixture 84 can include conductive traces or other electrical members configured for electrical communication with the conductors 18W on the multi layered tape 14W. This electrical connection can be formed by soldering, conductive adhesives, wire bonding or TAB tape.

In addition, the wafer probe handler 82 includes a force applying mechanism 86 and a force applying member 88. The force applying member 88 presses against a pressure plate 90 and a compressible member 92 in contact with a backside of the probe card 80. The compressible member 92 can be formed of an elastomeric material, such as silicone, or as a gas filled bladder. The compressible member 92 cushions the forces applied to the wafer 78 and allows the probe card 80 to self planarize to the wafer 78. The wafer probe handler 82 can also include a chuck (not shown) for supporting the wafer 78. Suitable wafer probe handlers 82 are commercially available from Electroglass and others.

While the invention has been described with reference to certain preferred embodiments, as will be apparent to those skilled in the art, certain changes and modifications can be made without departing from the scope of the invention as defined by the following claims.

What is claimed is:

1. An interconnect for a semiconductor die comprising:
   a substrate;
   a contact member on the substrate comprising a portion of the substrate and a conductive layer on the portion configured to electrically contact a contact location on the die;
   a multi layered tape attached to the substrate comprising a polymer film and a conductor on the polymer film; and
   a conductive material in physical contact with the conductive layer and with the conductor configured to form an electrical path therebetween.

2. The interconnect of claim 1 wherein the portion comprises a pillar having a surface and at least one projection on the surface configured to penetrate the contact location.

3. The interconnect of claim 1 further comprising an adhesive layer attaching the tape to the substrate and configured to form a first expansion joint between the conductor and the substrate.

4. The interconnect of claim 1 wherein the conductive material is configured to form a second expansion joint between the conductor and the contact member.

5. The interconnect of claim 1 wherein the contact location comprises a planar pad or a bump.

6. The interconnect of claim 1 wherein the conductor comprises copper and the film comprises polyimide.

7. An interconnect for a semiconductor die, comprising:
   a substrate;
   a contact member comprising a pillar which comprises a portion of the substrate, and a conductive layer on the pillar configured to electrically contact a contact location on the die;
   a multi layered tape bonded to the substrate comprising a polymer film and a conductor on the polymer film;
   an adhesive layer between the tape and the substrate configured to bond the tape to the substrate and to form a first expansion joint between the conductor and the substrate; and a conductive adhesive material between the conductive layer and the conductor configured to form an electrical path therebetween and a second expansion joint between the conductor and the contact member.

8. The interconnect of claim 7 wherein the pillar comprises a base and the conductor comprises an opening at least partially surrounding the base and at least partially filled with the conductive adhesive material.

9. The interconnect of claim 7 wherein the pillar comprises a surface and at least one projection on the surface configured to penetrate the contact location.

10. The interconnect of claim 7 wherein the adhesive layer comprises silicone.

11. An interconnect for a semiconductor die, comprising:
   a substrate;
   a contact member on the substrate configured to electrically contact a contact location on the die, the contact member comprising a raised portion of the substrate at least partially covered with a conductive layer;
   a multi layered tape bonded to the substrate comprising a polymer film and a metal conductor on the polymer film, the conductor and the polymer film having an opening therein configured to substantially surround the contact member with the contact member projecting therefrom; and
   a conductive adhesive deposited in the opening in electrical communication with the conductive layer and the conductor and configured to form an expansion joint between the conductor and the contact member.

12. The interconnect of claim 11 wherein the substrate comprises a plurality of contact members and the tape comprises a plurality of conductors having a plurality of openings substantially surrounding the contact members.

13. The interconnect of claim 11 wherein the substrate comprises a material selected from the group consisting of silicon, germanium, ceramic and glass.

14. The interconnect of claim 11 wherein the contact member comprises a base at least partially covered with the conductive layer and the conductor overlaps the conductive layer.

15. The interconnect of claim 11 wherein the conductor comprises copper and the polymer film comprises polyimide.

16. An interconnect for a semiconductor die, comprising:
   a substantially rigid substrate comprising a material selected from the group consisting of silicon, germanium, ceramic and glass;
   a contact member comprising a raised portion of the substrate and a conductive layer formed thereon configured to electrically contact a contact location on the die;
   a tape bonded to the substrate comprising a polymer film and a conductor on the polymer film, the polymer film and the conductor including an opening proximate to the contact member; and
   a conductive material placed in the opening in electrical communication with the conductive layer and the conductor.

17. The interconnect of claim 16 wherein the conductive material comprises a material selected from the group consisting of conductive adhesives and solder.

18. The interconnect of claim 16 wherein the conductive material comprises a conductive adhesive configured to form a first expansion joint between the contact member and the conductor.

19. The interconnect of claim 16 further comprising an adhesive layer between the tape and the substrate configured to bond the tare to the substrate and to form a second expansion joint between the conductor and the substrate.

20. The interconnect of claim 16 further comprising a second conductor on the polymer film having an impedance substantially equal to an impedance of the conductor.

21. An interconnect for a semiconductor die, comprising:
   a substantially rigid substrate comprising a material selected from the group consisting of silicon, germanium, ceramic and glass;
   a plurality of contact members on the substrate comprising raised portions of the substrate at least partially covered with conductive layers and configured to electrically contact a plurality of contact locations on the die, the raised portions comprising pillars having surfaces and a plurality of projections on the surfaces configured to penetrate the contact locations;
   a tape bonded to the substrate comprising a polymer film and a plurality of conductors on the polymer film; and
   a conductive adhesive material in electrical contact with the conductors and with the conductive layers and configured to form expansion joints between the conductors and the contact members.

22. The interconnect of claim 11 further comprising an electrically insulating layer on the conductors.

23. The interconnect of claim 11 wherein the polymer film comprises polyimide and the conductors comprise copper.

* * * * *

UNITED STATES PATENT AND TRADEMARK OFFICE
CERTIFICATE OF CORRECTION

PATENT NO : 6,025,731
DATED : Feb. 15, 2000
INVENTOR(S) : David R. Hembree, Salman Akram, Warren M. Farnworth, Alan G. Wood, James M. Wark, Derek Gochnour It is certified that error appears in the above-identified patent and that said Letters Patent is hereby corrected as shown below:

In claim 19 @ column 14, line 21, change "tare" to --tape--.

In claim 22 @ column 14, line 43, change "11" to --21--.

In claim 23 @ column 14, line 45, change "11" to --21--.

Signed and Sealed this

Nineteenth Day of December, 2000

Attest:

Q. TODD DICKINSON

*Attesting Officer*      *Commissioner of Patents and Trademarks*